United States Patent [19]
Ohji

[11] Patent Number: 5,337,274
[45] Date of Patent: Aug. 9, 1994

[54] NONVOLATILE SEMICONDUCTOR MEMORY DEVICE HAVING ADJACENT MEMORY CELLS AND PERIPHERAL TRANSISTORS SEPARATED BY FIELD OXIDE

[75] Inventor: Hiroshi Ohji, Kyoto, Japan

[73] Assignee: Rohm Co., Ltd., Kyoto, Japan

[21] Appl. No.: 4,525

[22] Filed: Jan. 14, 1993

[30] Foreign Application Priority Data

Jan. 30, 1992 [JP] Japan .................... 4-042236

[51] Int. Cl.⁵ .................... G11C 11/34; G11C 11/40
[52] U.S. Cl. .................... 365/185; 257/315; 257/316; 257/319; 257/344; 257/408
[58] Field of Search ............ 257/314, 315, 316, 326, 257/335, 336, 344, 408, 319, ; 365/185

[56] References Cited
U.S. PATENT DOCUMENTS

| | | | |
|---|---|---|---|
| 4,928,156 | 5/1990 | Alvis | 257/344 |
| 4,939,558 | 7/1990 | Smayling | 257/316 |
| 5,032,881 | 7/1991 | Sardo | 257/316 |
| 5,124,780 | 6/1992 | Sandhu | 257/344 |
| 5,210,436 | 5/1993 | Kakizoe | 257/344 X |
| 5,234,850 | 8/1993 | Liao | 257/344 X |
| 5,257,095 | 10/1993 | Liu | 257/315 |

Primary Examiner—Eugene R. LaRoche
Assistant Examiner—Son Mai
Attorney, Agent, or Firm—Braumbaugh, Graves, Donohue & Raymond

[57] ABSTRACT

The drain region of a memory cell transistor is constituted of a drain diffusion layer and a p⁻ diffusion layer to provide a steep gradient of the impurity concentration. The source region of the memory cell transistor is constituted of a source diffusion layer and an n⁻ diffusion layer to provide a gentle gradient of the impurity concentration. The LDD structure is employed in the source and drain regions of a peripheral transistor.

1 Claim, 2 Drawing Sheets

5,337,274

NONVOLATILE SEMICONDUCTOR MEMORY DEVICE HAVING ADJACENT MEMORY CELLS AND PERIPHERAL TRANSISTORS SEPARATED BY FIELD OXIDE

BACKGROUND OF THE INVENTION

The present invention relates to nonvolatile semiconductor memory devices, such as a flash EEPROM (electrically erasable and programmable ROM), which can store information using hot electrons that are generated in the vicinity of the drain and injected into the floating gate through the gate oxide film.

Referring to FIG. 3, a structure of this type of conventional nonvolatile semiconductor memory device is described below.

In FIG. 3, symbols Tr1 and Tr2 respectively represent a transistor constituting a flash memory cell and a transistor of a peripheral circuit such as a decoder portion. The transistors Tr1 and Tr2 are formed in respective areas on a p-type silicon substrate 1 that are separated by field oxide films 2. The memory cell transistor Tr1 includes a floating gate structure consisting of a floating gate 4, an interlayer insulating film 5 and a control gate 6 that are sequentially formed on a gate oxide film (also called a tunnel oxide film) 3a. The memory cell transistor Tr1 further has a source diffusion layer 7 and a drain diffusion layer 8 that are n+ diffusion layers formed in the substrate 1 on both sides of the above gate floating structure. The transistor Tr2 of the peripheral circuit consists of a gate electrode 9 formed on a gate oxide film 3b and a source diffusion layer 10 and a drain diffusion layer 11 that are n+ diffusion layers formed on both sides of the gate electrode 9.

In the flash memory cell having the above structure, hot electrons are generated in the vicinity of the drain diffusion layer 8 by a strong electric field that is formed there by applying a positive high voltage to the control gate 6 and a positive voltage to the drain diffusion layer 8. The hot electrons thus generated are injected into the floating gate 4 through the gate oxide film 3a to provide nonvolatile information storage.

However, the conventional memory device having the above structure is associated with the following problems.

To accommodate the strong requirement for high integration that is imposed on the nonvolatile semiconductor memory devices of the above type, attempts of miniaturizing the constituent semiconductors are now in progress. However, since the peripheral transistor Tr2 of the above memory device has what is called a single drain structure, excessive shortening of the gate length for the miniaturization is likely to increase electric field intensity in the vicinity of the drain diffusion layer 11 and generate hot electrons there. The hot electrons thus generated are trapped in the gate oxide film 3b of the transistor Tr2, and form fixed negative charge, which shifts the threshold voltage of the transistor Tr2 to the positive side, to cause an erroneous operation of a circuit.

To solve the above problem associated with the miniaturization, MOSFETs having what is called a LDD (lightly-doped drain) structure have been proposed in which a low impurity concentration (n−) layer is provided in the vicinity of the drain diffusion layer 11 to prevent the excessive electric field concentration there. However, if the LDD structure is equally applied to all the transistors constituting the nonvolatile semiconductor memory device, the hot electron generation in the vicinity of the drain diffusion layer 8 of the memory cell transistor Tr1 is also suppressed to cause another kind of problem, i.e., a reduction of the information writing efficiency.

SUMMARY OF THE INVENTION

The present invention has been made in view of the above circumstances, and has an object of providing a nonvolatile semiconductor memory device which can improve the writing efficiency of a memory cell transistor as well as miniaturize a transistor of a peripheral circuit.

Another object of the invention is to provide a manufacturing method for the above nonvolatile semiconductor memory device.

According to the invention, in a nonvolatile semiconductor memory device comprising a semiconductor substrate of a first conductivity type, a memory cell transistor that stores information by injecting hot electrons generated in the vicinity of a drain into a floating gate of a floating gate structure through a gate oxide film, and a peripheral transistor that is part of a peripheral circuit, said memory cell transistor comprises source and drain diffusion layers formed in the semiconductor substrate on both sides of the floating gate structure and having a high impurity concentration of a second conductivity type, a source-side diffusion layer formed between the source diffusion layer and the semiconductor substrate and having a low impurity concentration of the second conductivity type, and a drain-side diffusion layer formed between the drain diffusion layer and the semiconductor substrate and having a low impurity concentration of the first conductivity type; and said peripheral transistor comprises source and drain diffusion layers formed in the semiconductor substrate on both sides of a gate electrode and having a high impurity concentration of the second conductivity type, and source-side and drain-side diffusion layers respectively formed between the source diffusion layer and the semiconductor substrate and between the drain diffusion layer and the semiconductor substrate and having a low impurity concentration of the second conductivity type.

According to a second aspect of the invention, a method of producing a nonvolatile semiconductor memory device comprising a semiconductor substrate of a first conductivity type, a memory cell transistor that stores information by injecting hot electrons generated in the vicinity of a drain into a floating gate of a floating gate structure through a gate oxide film, and a peripheral transistor that is part of a peripheral circuit, comprises the steps of:

forming the floating gate structure of the memory cell transistor and a gate electrode of the peripheral transistor in respective device areas separated by gate oxide films on a gate oxide film that is formed on the semiconductor substrate;

forming a low impurity concentration diffusion layer of a second conductivity type by self-aligning in each of a source region of the memory cell transistor and source and drain regions of the peripheral transistor by diffusing impurities of the second conductivity type into the semiconductor substrate while masking a drain region of the memory cell transistor;

forming a low impurity concentration diffusion layer of the first conductivity type by self-aligning in the drain region of the memory cell transistor by diffusing impurities of the first conductivity type into the semiconductor substrate while masking the source region of the memory cell transistor and the source and drain regions of the peripheral transistor; and forming by self-aligning high impurity concentration source and drain diffusion layers of the second conductivity type in part of the low impurity concentration diffusion layers of the first and second conductivity types by forming side wall spacers on side faces of the floating gate structure of the memory cell transistor and of the gate electrode of the peripheral transistor and then diffusing impurities of the second conductivity type into the semiconductor substrate.

DESCRIPTION OF THE PREFERRED EMBODIMENTS

Embodiments of the present invention are described hereinafter with reference to the accompanying drawings.

Figure 1:
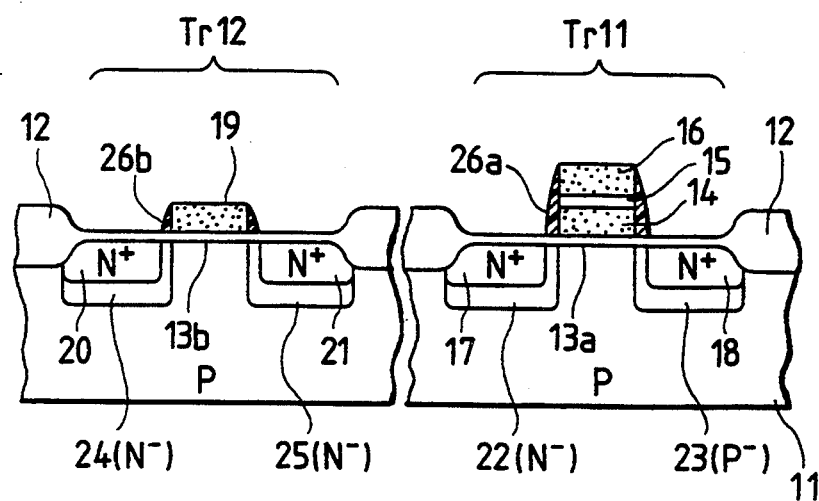
FIG. 1 is a sectional view showing a device structure of a nonvolatile memory device according to an embodiment of the present invention.
Figure 3:
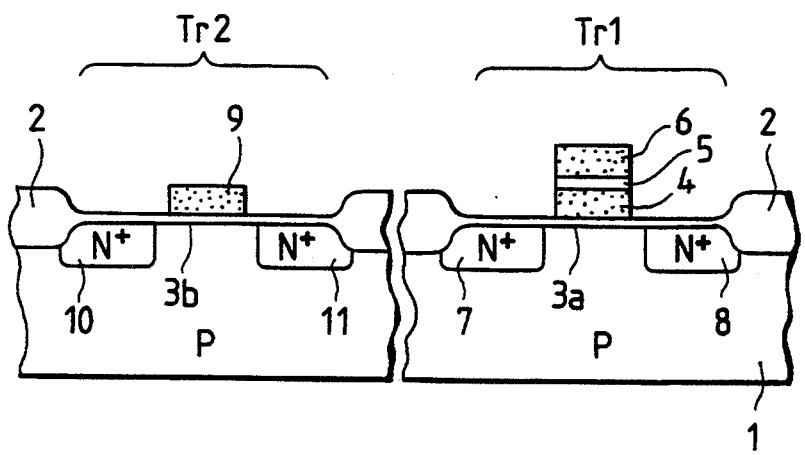
FIG. 3 is a sectional view showing a device structure of a conventional nonvolatile semiconductor memory device.

FIG. 1 is a sectional view showing a device structure of a nonvolatile semiconductor memory device according to an embodiment of the invention.

In FIG. 1, symbols Tr11 and Tr12 respectively represent a transistor constituting a flash memory cell and a transistor of a peripheral circuit such as a decoder portion. The transistors Tr11 and Tr12 are formed in respective areas on a p-type silicon substrate 11 that are separated by field oxide films 12. The memory cell transistor Tr11 includes a floating gate structure consisting of a floating gate 14, an interlayer insulating film 15 and a control gate 16 that are sequentially formed on a gate oxide film (also called a tunnel oxide film) 13a. The memory cell transistor Tr11 further has a source diffusion layer 17 and a drain diffusion layer 18 that are n+ diffusion layers formed in the substrate 11 on both sides of the above floating gate structure. Further, in the memory cell transistor Tr11, an n− diffusion layer 22 is interposed between the source diffusion layer 17 and the silicon substrate 11, and a p− diffusion layer 23 is interposed between the drain diffusion layer 18 and the silicon substrate 11. Symbol 26a represents side wall spacers formed on the side faces of the floating gate structure.

On the other hand, the transistor Tr12 of the peripheral circuit consists of a gate electrode 19 formed on a gate oxide film 13b, a source diffusion layer 20 and a drain diffusion layer 21 that are n+ diffusion layers formed on both sides of the gate electrode 19, and n− diffusion layers 24 and 25 interposed between the diffusion layers 20 and 21 and the silicon substrate 11. Symbol 26b represents side wall spacers formed on the side faces of the gate electrode 19.

In the memory cell transistor Tr11, the drain region has a steep gradient of the impurity concentration by virtue of the double structure of the n+ drain diffusion layer 18 and the p− diffusion layer 23. Therefore, when a positive voltage is applied to the drain region for information writing, the expansion of the depletion layer in the vicinity of the drain is suppressed and an electric field is concentrated there, so that the hot electron generation is accelerated and the information writing can be performed at a high efficiency. Further, the source region has a gentle gradient of the impurity concentration by virtue of the double structure of the n+ source diffusion layer 17 and the n− diffusion layer 22, improving resistance to the breakdown due to the high voltage that is applied to the source region when the information stored in the floating gate 14 is erased.

On the other hand, the source and drain regions of the peripheral transistor Tr12 have a gentle gradient of the impurity concentration by virtue of the double structures of the n+ source diffusion layer 20 and n− diffusion layer 24 and of the n+ drain diffusion layer 21 and n− diffusion layer 25, respectively. As a result, depletion layers expand in the vicinity of the source and drain regions to reduce the concentration of electric fields there, to thereby suppress the generation of hot electrons, This will make it possible to shorten the gate length of the peripheral transistor Tr12, to enable its miniaturization.

Next, with reference to FIGS. 2(a)-2(d), a manufacturing method of the nonvolatile semiconductor memory device of FIG. 1 is described.

STEP 1

Figure 2A:
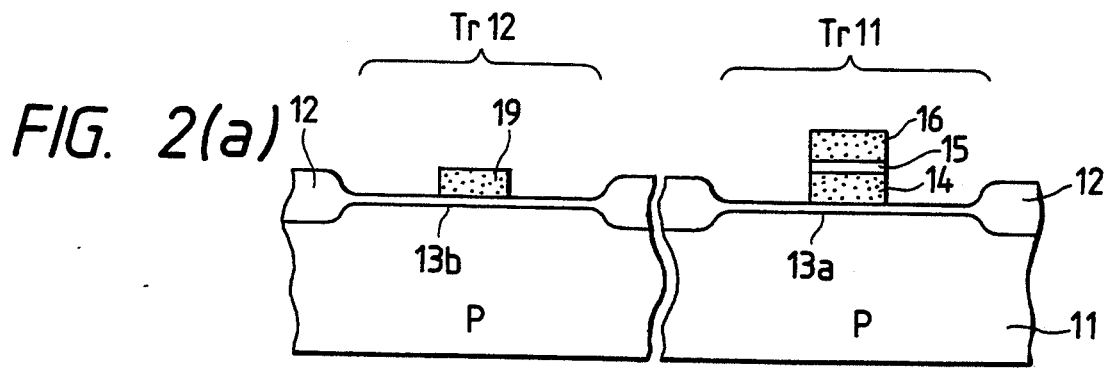
FIGS. 2(a)-2(d) are sectional views showing manufacturing steps of the memory device of FIG. 1.
Figure 2B:
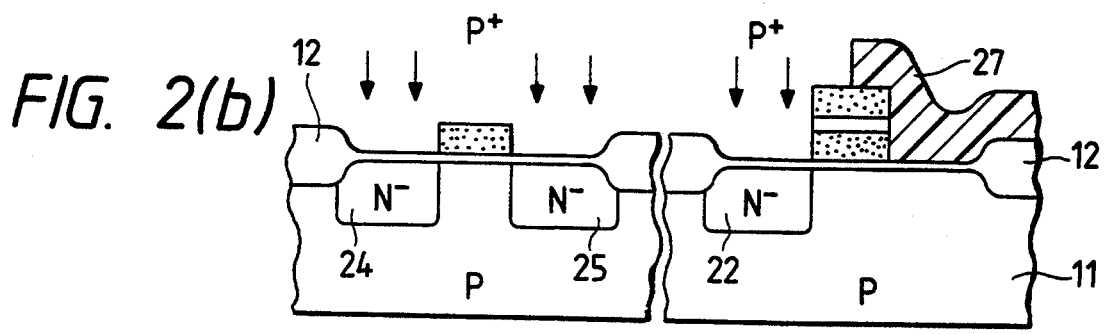

Referring to FIG. 2(a), first the field oxide films 12 are deposited on the p-type silicon substrate 11 to separate the device areas for the memory cell transistor Tr11 and the peripheral transistor Tr12. Then, the gate oxide films 13a and 13b are formed in those device areas. The floating gate structure is formed on the gate oxide film 13a of the memory cell transistor Tr11 by sequentially laying, in the following order, the floating gate 14 made of conductive polysilicon doped with phosphorus etc., the interlayer insulating layer 15 made of, for instance, a double insulating layers of SiO2/-Si3N4, and the control gate 16 made of conductive polysilicon doped with phosphorus etc. Further, the gate electrode 19 made of conductive polysilicon is formed on the gate oxide film 13b of the peripheral transistor Tr12.

Step 2

Referring to FIG. 2((b), the n− diffusion layers 22, 24 and 25 are formed at one time by self-aligning in the source region of the memory cell transistor Tr11 and in the source and drain regions of the peripheral transistor Tr12 by implanting phosphorus ions while masking the drain region of the memory cell transistor Tr11 by a photoresist pattern 27.

Step 3

Figure 2C:
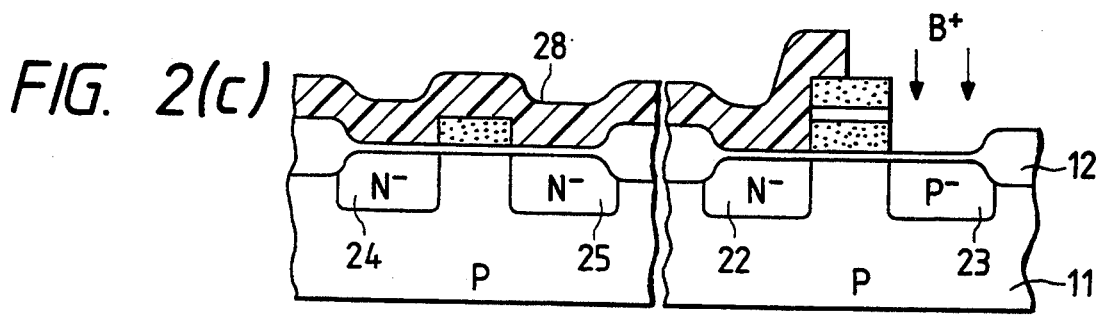

Referring to FIG. 2(c), the p− diffusion layer 23 is formed by self-aligning in the drain region of the memory cell transistor Tr11 by implanting boron ions while masking the source region of the memory cell transistor Tr11 and the source and drain regions of the peripheral transistor Tr12 by a photoresist pattern 28.

Step 4

Figure 2D:
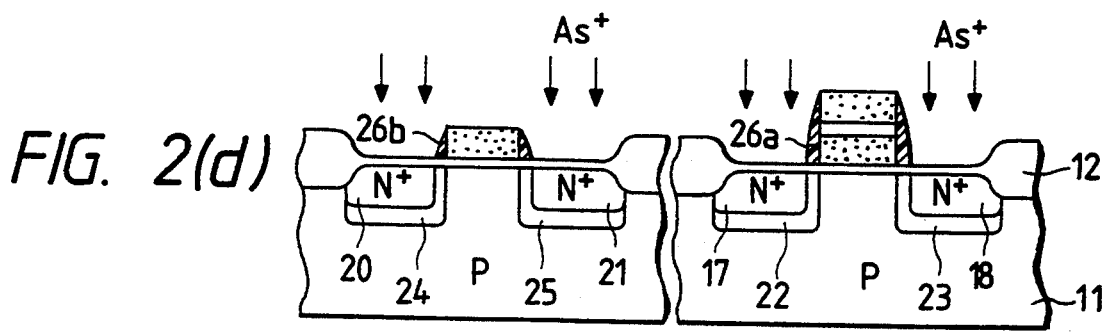

Referring to FIG. 2(d), the silicon dioxide side wall spacers 26a and 26b are respectively formed on the side faces of the floating gate structure (14, 15 and 16) and the gate electrode 19 by depositing a silicon dioxide film on the entire surface of the silicon substrate 11 and then etching back this silicon dioxide film, for instance, by plasma etching. Then, by implanting arsenic ions, n+ source diffusion layers 17 and 20 and the n+ drain diffusion layers 18 and 21 are formed in the source and drain regions of the memory cell transistor Tr11 and the peripheral transistor Tr12 at one time by self-aligning.

Although in the above embodiment the p− diffusion layer 23 is formed after formation of the n− diffusion layers 22, 24 and 25, the invention is not limited to this process. That is, steps 2 and 3 may be interchanged, in which case the p− diffusion layer 23 is rosined first and then the n− diffusion layers 22, 24 and 25 are formed.

Further, the invention is not limited to the conductivity types described in the above embodiments. That is, the invention can apparently be applied to the nonvolatile semiconductor memory device having the opposite conductivity types.

As is apparent from the above description, in the nonvolatile semiconductor memory device of the invention, the gradient of the impurity concentration is made steep in the drain region of the memory cell transistor to concentrate an electric field there, to thereby accelerate the generation of hot electrons there. This will enable the efficient information writing. On the other hand, since the impurity concentration is made gentle in the source region of the memory cell transistor, the resistance to high voltage breakdown at the time of information erasure can be improved. Further, what is called a LDD structure is employed in the peripheral transistor to reduce the electric field intensity, to thereby suppress the generation of hot electrons. Therefore, the peripheral transistor can be miniaturized by shortening the gate length.

Further, in the manufacturing method of the invention, in step 2 the low-concentration impurity diffusion layer is formed in the source region of the memory cell transistor and in the source and drain regions of the peripheral transistor at one time by self-aligning, and in step 4 the source diffusion layers and the drain diffusion layers of the respective transistors are formed at one time by self-aligning. Therefore, the nonvolatile semiconductor memory device can be produced relatively easily.

What is claimed is:

1. A nonvolatile semiconductor memory device comprising a semiconductor substrate of a first conductivity type, a memory cell transistor including a floating gate structure having a floating gate separated from the semiconductor substrate by a gate oxide film and including first source and drain diffusion layers formed in the semiconductor substrate on opposite sides of the floating gate structure and having a high impurity concentration of a second conductivity type, a second source diffusion layer in the semiconductor substrate adjacent to the first source diffusion layer having a low impurity concentration of the second conductivity type, and a second drain diffusion layer int he semiconductor substrate adjacent to the first drain diffusion layer and having a low impurity concentration of the first conductivity type, a peripheral transistor formed adjacent to the memory cell transistor having a gate electrode spaced from the semiconductor substrate by a gate oxide film, and first source and drain diffusion layers formed in the semiconductor substrate on opposite sides of the gate electrode, each having a high impurity concentration of the second conductivity type, and a second source diffusion layer and a second drain diffusion layer in the semiconductor substrate adjacent to the first source diffusion layer and the first drain diffusion layer, respectively, in the peripheral transistor, each having a low impurity concentration of the second conductivity type, and a field oxide film separating the diffusion layers of the memory cell transistor from those of the peripheral transistor.

* * * * *